US012766692B2

(12) United States Patent
Lacher et al.

(10) Patent No.: US 12,766,692 B2
(45) Date of Patent: Oct. 20, 2026

(54) PRELOAD DEVICE FOR A CIRCUIT BOARD

(71) Applicant: Hilti Aktiengesellschaft, Schaan (LI)

(72) Inventors: Michael Lacher, Schwabmuenchen (DE); Jerome Jaromin, Munich (DE)

(73) Assignee: Hilti Aktiengesellschaft, Schaan (LI)

( * ) Notice: Subject to any disclaimer, the term of this patent is extended or adjusted under 35 U.S.C. 154(b) by 325 days.

(21) Appl. No.: 18/276,054

(22) PCT Filed: Nov. 18, 2021

(86) PCT No.: PCT/EP2021/082071
§ 371 (c)(1),
(2) Date: Aug. 7, 2023

(87) PCT Pub. No.: WO2022/174946
PCT Pub. Date: Aug. 25, 2022

(65) Prior Publication Data
US 2025/0073883 A1 Mar. 6, 2025

(30) Foreign Application Priority Data
Feb. 16, 2021 (EP) .................................... 21157376

(51) Int. Cl.
*B25F 5/00* (2006.01)
*H05K 7/20* (2006.01)

(52) U.S. Cl.
CPC ......... *B25F 5/008* (2013.01); *H05K 7/20154* (2013.01)

(58) Field of Classification Search
CPC ............................ B25F 5/008; H05K 7/20154
See application file for complete search history.

(56) References Cited

U.S. PATENT DOCUMENTS 3,594,521 A * 7/1971 Roll ........................ H01H 35/34 200/441
4,215,361 A * 7/1980 McCarthy ........... H10W 40/641 174/16.3
5,309,979 A * 5/1994 Brauer ................ H10W 40/641 174/16.3
(Continued)

FOREIGN PATENT DOCUMENTS

CN 1199539 A 11/1998
CN 208210569 U 12/2018
(Continued)

OTHER PUBLICATIONS

International Search Report of PCT/EP2021/082071 dated Feb. 10, 2022.

*Primary Examiner* — Dariush Seif
(74) *Attorney, Agent, or Firm* — Davidson Kappel LLC

(57) ABSTRACT

A control apparatus for a power tool containing at least one circuit board, a heat-conducting element, a cooling device for cooling the at least one circuit board, and at least one housing element, wherein, in a mounted state of the control apparatus, the circuit board and the heat-conducting element are arranged between the cooling device and the housing element, and wherein the heat-conducting element is positioned between the circuit board and the cooling device. A preload device is contained between the housing element and the at least one circuit board in order to press the circuit board against the heat-conducting element in a predefined direction.

19 Claims, 4 Drawing Sheets

(56) References Cited

U.S. PATENT DOCUMENTS

| | | | | | |
|---|---|---|---|---|---|
| 5,402,313 | A * | 3/1995 | Casperson | H05K 7/2049 | 174/16.3 |
| 5,576,933 | A * | 11/1996 | Campanella | H01L 23/4093 | 174/16.3 |
| 5,640,304 | A * | 6/1997 | Hellinga | H01L 23/40 | 257/E23.083 |
| 5,648,889 | A * | 7/1997 | Bosli | H10W 40/611 | 257/E23.084 |
| 5,808,868 | A * | 9/1998 | Drekmeier | H05K 7/20472 | 361/709 |
| 6,185,100 | B1 | 2/2001 | Bentz et al. | | |
| 6,504,712 | B2 * | 1/2003 | Hashimoto | H10W 70/027 | 174/16.3 |
| 6,885,557 | B2 * | 4/2005 | Unrein | H10W 40/611 | 248/510 |
| 7,095,614 | B2 * | 8/2006 | Goldmann | H10W 40/611 | 165/185 |
| 7,193,854 | B2 * | 3/2007 | Bonomo | H05K 7/20254 | 174/15.1 |
| 7,570,490 | B2 * | 8/2009 | Refai-Ahmed | H10W 40/641 | 361/720 |
| 7,746,653 | B2 * | 6/2010 | Negrut | H10W 40/611 | 165/185 |
| 8,477,502 | B2 * | 7/2013 | Single | B25F 5/008 | 361/720 |
| 8,520,393 | B2 * | 8/2013 | Homer | G06F 1/20 | 165/122 |
| 9,013,869 | B2 * | 4/2015 | Degner | H05K 7/20 | 361/679.52 |
| 9,313,923 | B2 * | 4/2016 | Davis | H01L 23/4006 | |
| 9,379,037 | B2 * | 6/2016 | Degner | H05K 7/20336 | |
| 10,170,391 | B2 * | 1/2019 | Dickover | H05K 7/2039 | |
| 10,541,588 | B2 * | 1/2020 | Wachter | B25F 5/00 | |
| 10,687,433 | B1 * | 6/2020 | Raic | H05K 7/1468 | |
| 11,404,350 | B2 * | 8/2022 | Chia | H10W 40/611 | |
| 2006/0002089 | A1 * | 1/2006 | Tran | H01L 23/4006 | 257/E23.09 |
| 2006/0082975 | A1 * | 4/2006 | Caines | H05K 7/2049 | 361/719 |
| 2008/0037223 | A1 | 2/2008 | Muller et al. | | |
| 2009/0147480 | A1 * | 6/2009 | Lee | H01L 23/4093 | 361/702 |
| 2012/0262878 | A1 * | 10/2012 | Ikeda | G06F 1/20 | 361/720 |
| 2013/0164567 | A1 * | 6/2013 | Olsson | H01M 10/425 | 429/93 |
| 2014/0254100 | A1 * | 9/2014 | Martin | H01L 23/3675 | 361/709 |
| 2019/0388983 | A1 * | 12/2019 | Numata | B23D 59/001 | |
| 2020/0126889 | A1 * | 4/2020 | Mao | H10W 40/611 | |
| 2025/0073883 | A1 * | 3/2025 | Lacher | B25F 5/008 | |

FOREIGN PATENT DOCUMENTS

| | | | |
|---|---|---|---|
| DE | 69401040 | T2 | 6/1997 |
| DE | 102010035169 | A1 | 2/2012 |
| DE | 102019116539 | A1 | 12/2019 |
| EP | 0634890 | B1 | 12/1996 |
| EP | 1995121 | A1 | 11/2008 |
| JP | 2002280499 | A | 9/2002 |

* cited by examiner

PRELOAD DEVICE FOR A CIRCUIT BOARD

The present invention relates to a control apparatus for a power tool containing at least one circuit board, a heat-conducting element, a cooling device for cooling the at least one circuit board, and at least one housing element.

BACKGROUND

Control apparatuses for power tools are very widely known from the prior art. The control apparatus is used for controlling or regulating the functions of the power tool, for example the rotational speed of the drive (e.g. electric motor) of the power tool. The control apparatus may also be referred to as a control and regulating apparatus, or a regulating apparatus.

SUMMARY OF THE INVENTION

The production of heat may be problematic in the control apparatus since excessive temperatures in the interior of the control apparatus may lead to damage to individual components of the control apparatus and/or to total failure of the power tool.

Various cooling devices are already very widely known from the prior art. The design or the construction of control apparatuses with such cooling devices, and in particular the attachment of heat-generating components, for example circuit boards with capacitors, coils or other components, to the cooling devices, is often complex, costly and not sufficiently effective.

It is an object of the present invention to provide a control apparatus for a power tool containing at least one circuit board, a heat-conducting element, a cooling device for cooling the at least one circuit board, and at least one housing element, wherein, in a mounted state of the control apparatus, the circuit board and the heat-conducting element are arranged between the cooling device and the housing element, and wherein the heat-conducting element is positioned between the circuit board and the cooling device, which control apparatus solves at least the problems mentioned above.

The present invention provides a control apparatus for a power tool containing at least one circuit board, a heat-conducting element, a cooling device for cooling the at least one circuit board, and at least one housing element, wherein, in a mounted state of the control apparatus, the circuit board and the heat-conducting element are arranged between the cooling device and the housing element, and wherein the heat-conducting element is positioned between the circuit board and the cooling device.

According to the invention, a preload device is contained between the housing element and the circuit board in order to press the at least one circuit board against the heat-conducting element in a predefined direction. By this means, a better thermal attachment of the heat-generating circuit board to the cooling device is achieved, such that overall the cooling of the control apparatus can be improved.

The heat-conducting element can be at least partially produced from metal or a metal alloy. It is possible for the heat-conducting element to be at least partially composed of copper.

The control apparatus may also be referred to as a control and regulating apparatus, or as a regulating apparatus.

According to an advantageous embodiment of the present invention, it may be possible for the preload device to contain at least a first spring element and a second spring element. The first and second spring element differ in shape or configuration in this case. The first spring element can have a larger volume or a greater size than the second spring element. The different configurations of the first and second spring element make it possible for the preload device to exert a greatly differing force or pressure on the circuit board and the heat-conducting element at different locations.

According to an advantageous embodiment of the present invention, it may be possible for the first spring element to have a first extent in a predefined direction and for the second spring element to have a second extent in the predefined direction. By this means, at a certain position of the circuit board and/or of the heat-conducting element, the first spring element can exert a different force or a different pressure than the second spring element. In other words: the spring elements which differ in height can thereby exert correspondingly different contact forces or contact pressures. The extent of the spring elements may also be referred to as an elevation or height.

According to an advantageous embodiment of the present invention, it may be possible for the preload device to be configured at least partially from a resilient material. The preload device thereby has a resilient function. Furthermore, the use of the resilient material means that the preload device can be lighter and, especially, can be positioned flexibly in the control apparatus.

According to an alternative refinement, it is possible for the preload device to contain a pad. The pad is used to connect the spring elements to one another.

According to an advantageous embodiment of the present invention, it may be possible for the preload device to be configured at least partially from silicone. This enables the preload device to be flexibly adapted in the control apparatus.

Further advantages will become apparent from the following description of the figures. Various exemplary embodiments of the present invention are illustrated in the figures. The figures, the description and the claims contain numerous features in combination. A person skilled in the art will expediently also consider the features individually and combine them to produce useful further combinations.

DETAILED DESCRIPTION

Figure 1:
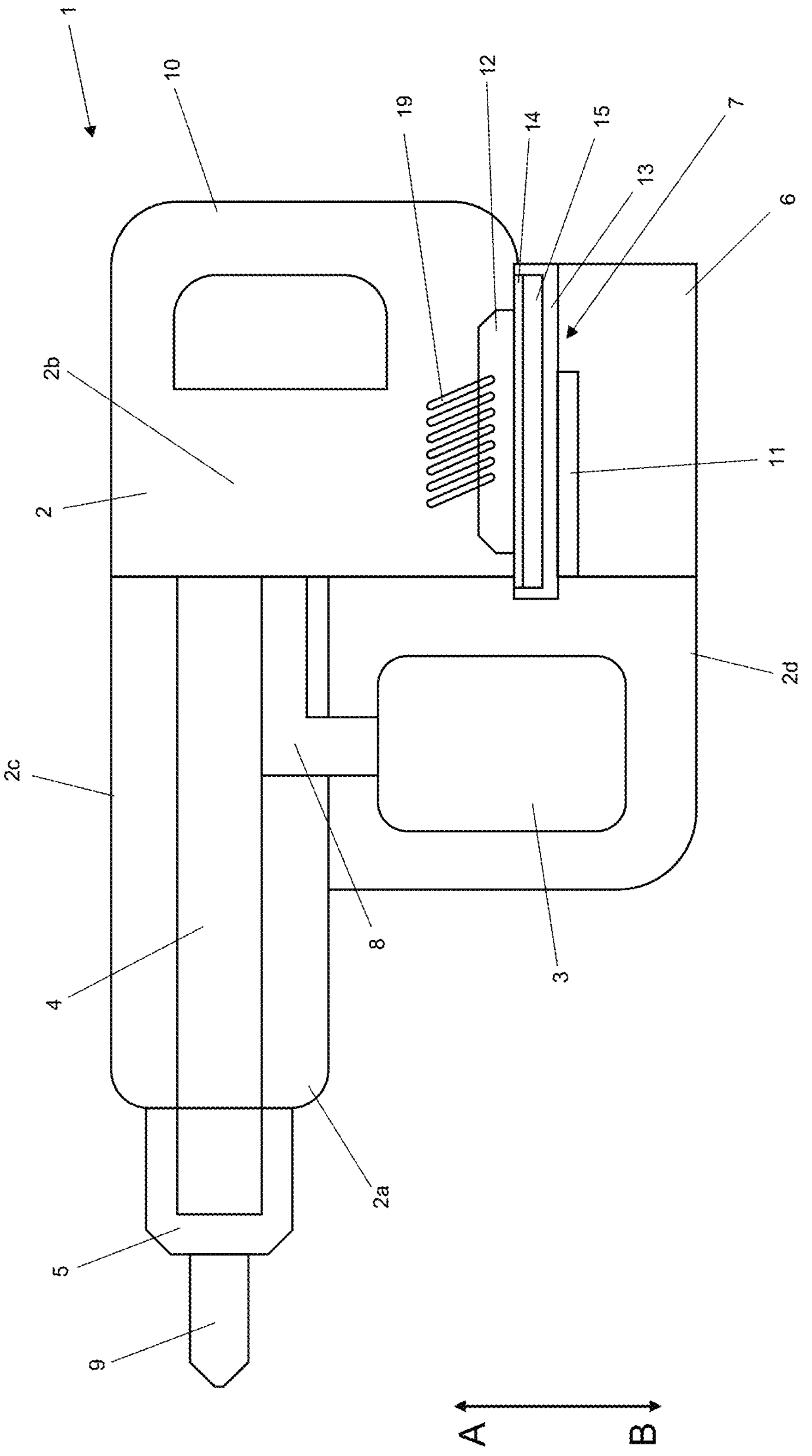
FIG. 1 shows a side view of a power tool of a first embodiment with a control apparatus according to the invention.

FIG. 1 shows a power tool 1 in the form of a hammer drill. The power tool 1 configured as a hammer drill essentially comprises a housing 2, a drive 3, an impact mechanism 4, a tool fitting 5, a power supply 6, and a control apparatus 7.

The drive 3 can be configured in the form of an electric motor. The drive 3 configured in the form of an electric motor serves for generating a torque which is transmitted to the impact mechanism 4 via a transmission 8. The impact mechanism 4 generates pulse-like impacts which can be transmitted by means of the tool fitting 5 to a tool 9 accommodated and held in the tool fitting. The drive 3, the transmission 8 and also the impact mechanism 4 are positioned in the interior of the housing 2.

Alternatively, the power tool 1, instead of being configured as a hammer drill, may also be configured as a saw, a grinding device or the like.

The housing 2 has a front end 2*a*, a rear end 2*b*, an upper end 2*c* and a lower end 2*d*. A handle 10 is positioned at the rear end 2*b* of the housing 2. The handle 10 serves to hold and guide the power tool 1. The tool fitting 5 is positioned opposite, at the front end 2*a* of the housing 2. The tool fitting 5 serves to receive and hold the tool 5. If the power tool 1 is configured as a hammer drill, the tool 9 is configured as a drill or chisel.

The power supply 6 serves to supply electrical energy to the power tool 1. As indicated in FIG. 1, the power supply 6 is configured as a rechargeable battery. The rechargeable battery 6 is connectable re-releasably to the lower end 2*d* and/or rear end 2*b* of the housing 2 via an interface 11. Alternatively, instead of a rechargeable battery, the power supply 6 may also be configured as a network part to which the power tool 1 is connectable re-releasably by a socket.

Figure 2:
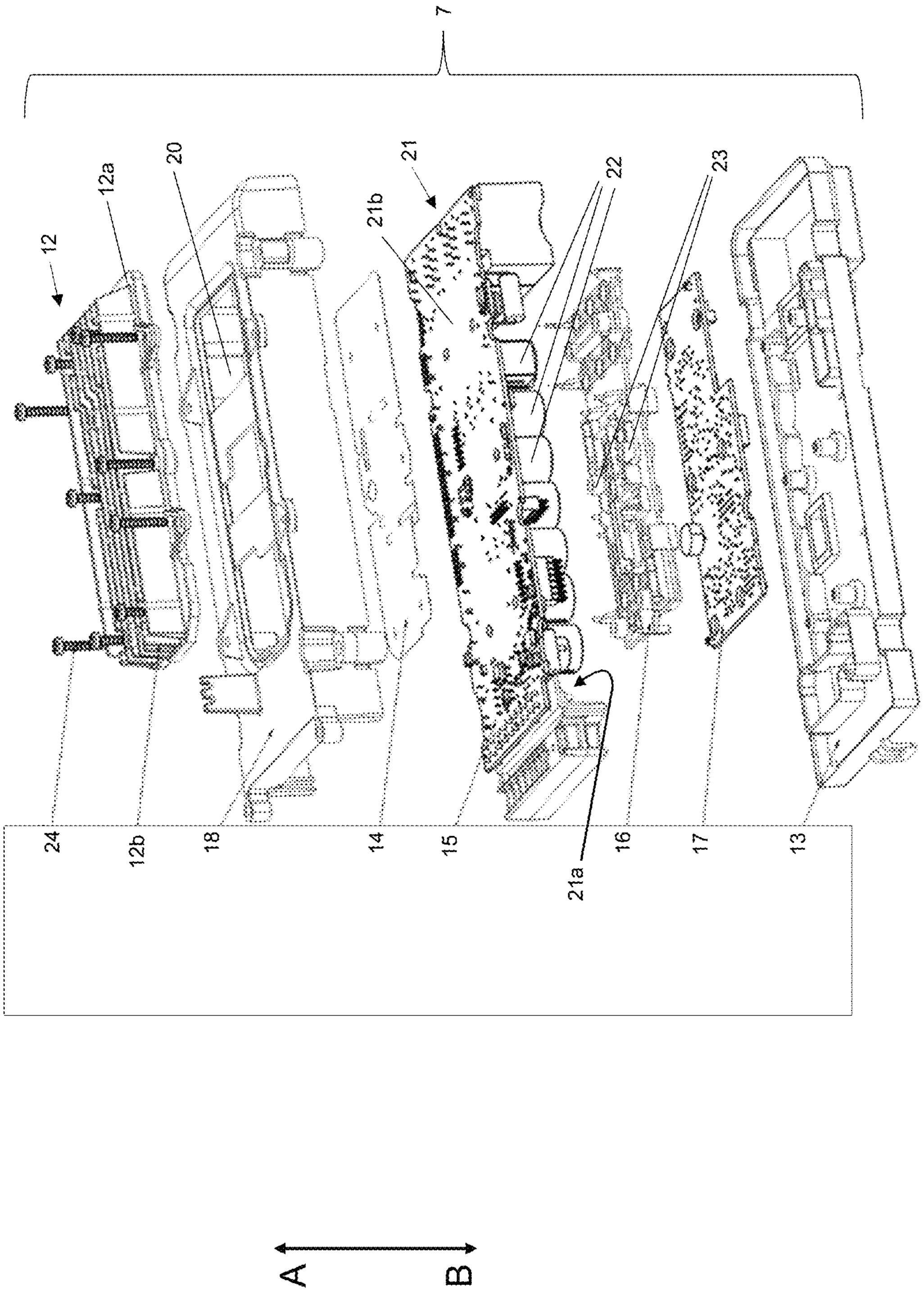
FIG. 2 shows a perspective view of the components of a second embodiment of the control apparatus according to the invention with a cooling device, a first housing element, a heat-conducting element, a first circuit board, a preload device, a second circuit board, and a second housing element.
Figure 4:
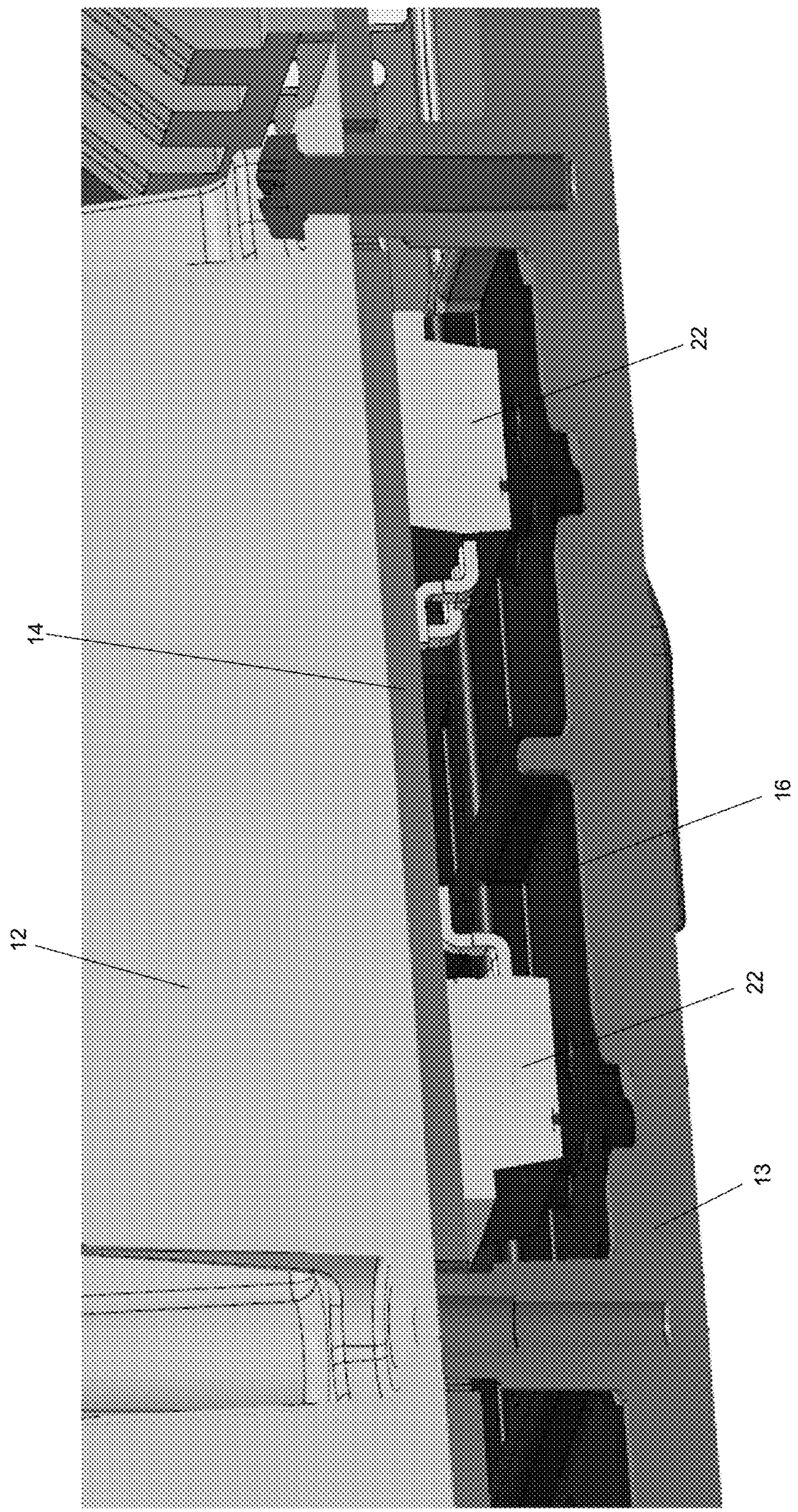
FIG. 4 shows a detailed view of the first embodiment of the control apparatus according to the invention.
Figure 4:

FIGS. 1 and 4 show a first embodiment of the control apparatus 7. FIG. 2 shows a second embodiment of the control apparatus 7.

The control apparatus 7 is substantially positioned at the rear and lower end 2*b*, 2*d* of the housing 2 and serves for controlling and regulating the different functions of the power tool 1. One of these functions is, for example, the rotational speed of the drive 3 which is configured as an electric motor. According to the first embodiment, the control apparatus 7 has a cooling device 12, a housing element 13, a heat-conducting element 14, a circuit board 15, and a preload device 16, cf. FIGS. 1 and 4.

According to the second embodiment, the control apparatus 7 has a cooling device 12, a first housing element 13, a heat-conducting element 14, a first circuit board 15, a preload device 16, a second circuit board 17, and a second housing element 18, cf. FIG. 2. The first housing element 13 is a lower housing element in direction B. The second housing element 18 is an upper housing element in direction A.

As can be seen in FIGS. 1 and 4, the first (and sole) housing element 13 of the first embodiment of the control apparatus 7 is the lower housing element in direction B.

The cooling device 12 is substantially configured in the form of a baseplate 12*a* with protruding cooling elements 12*b*. The cooling elements 12*b* are configured as cooling ribs. The cooling ribs may also be referred to as cooling fins. Heat generated in the interior of the control apparatus 7 can be transmitted to the environment, and therefore the actual cooling achieved, by means of the cooling device 12. As can be seen in FIG. 2, the cooling device 12 is arranged behind or next to ventilation openings 19 of the housing 2 of the power tool 1 (see, e.g, also FIG. 1). Air can flow through the ventilation openings 19 into the interior of the housing 2 of the power tool 1 and along the cooling elements 19 configured as cooling ribs.

As is shown in FIG. 2, the second housing element 18 is configured in the form of a cover. A cutout 20, via which the cooling element 12*b* is fastened, is provided on an upper side of the first housing element 18.

The heat-conducting element 14 is configured in the form of a flat pad made from a heat-conductive material. The heat-conductive material is copper. The heat-conducting element 14 is positioned in direction B below the second housing element 18, which is configured as a cup.

The first circuit board 15 is configured as a power printed circuit board and is positioned in direction B below the heat-conducting element 14. As is apparent in particular in FIG. 2, the first circuit board 15 consists of the actual carrier plate 21 and a number of electrical or electronic components 22. The components 22 can be, for example, capacitors, coils, transistors or the like. The carrier plate 21 contains a first side 21*a* and a second side 21*b*. These components 22 are fastened to the first side 21*a* of the printed circuit board. By contrast, no components are fastened to the second side 21*b*, and therefore the second side 21*b* is substantially flat. The first circuit board 15 is positioned in the control apparatus 7 in such a manner that the first side 21*a* of the carrier plate 21 with the components 22 points in direction B and the second (flat) side 21*b* of the carrier plate 21 points in direction A.

Figure 3:
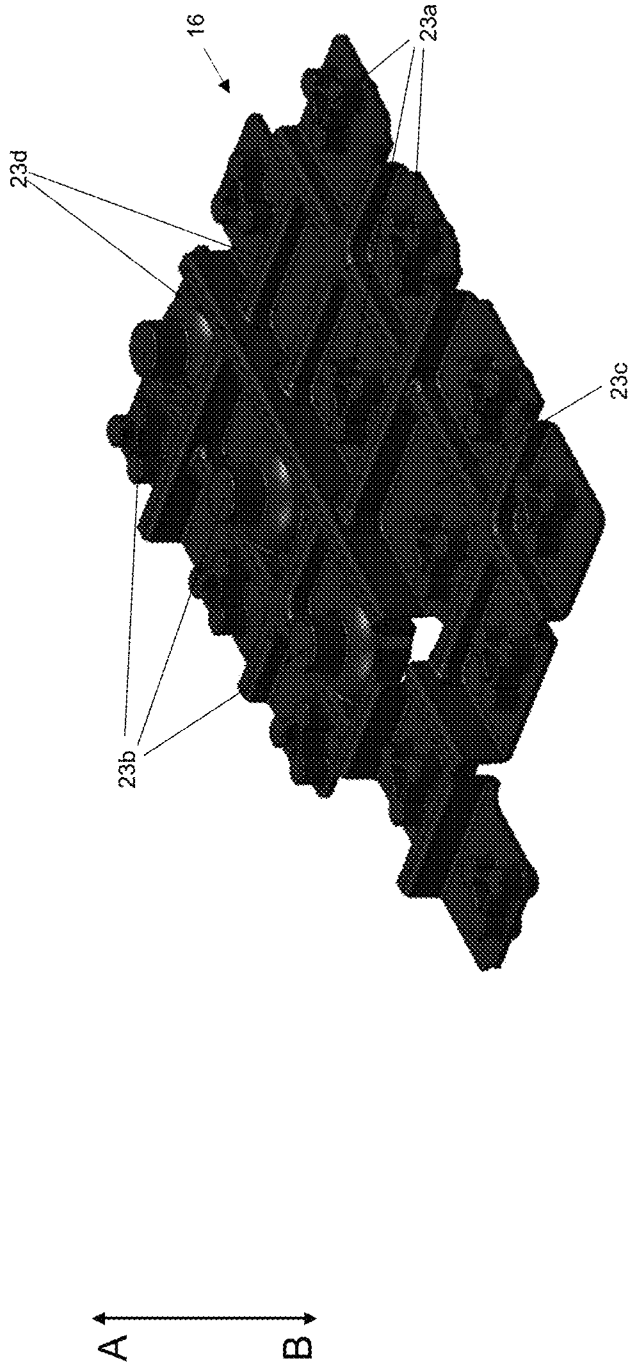
FIG. 3 shows a perspective view of the preload device with a number of first and second spring elements.

The preload device 16 is configured in the form of a resilient pad with a number of spring elements 23. FIG. 3 shows an exemplary embodiment of the preload device 16, in which thirteen spring elements 23 in the form of small triangular elevations 23*a* and three spring elements 23 in the form of large cylindrical elevations 23*b* are positioned on a pad 23*c*. Webs 23*d* in the form of elongate elevations are present between the individual spring elements 23. Alternatively, more or fewer than three large and thirteen small spring elements 23 may be present. The number, shape and position of the large and small elevations depend on the number, shape and position of the electrical or electronic components 22 on the first circuit board 15. The smaller a component 22 on the first circuit board 15 is, i.e. the shorter a component 22 extends in direction B from the first side 21*a* of the circuit board 15, the larger is the spring element 23 on the preload device 16, i.e. the further the spring element 23, which is configured as an elevation, extends from the pad in direction A.

The preload device 16 serves for exerting force or pressure on the first circuit board 15, such that, in a mounted state of the control apparatus 7, the first circuit board 15 is pressed in direction A onto the heat-conducting element 14 and the cooling device 12. Within a linear region, there is the relationship that the greater the heat-generating circuit board 15 is pressed onto the heat-conducting element 14 and the cooling device 12 in direction A, the better is heat transmitted from the first circuit board 15 to the cooling device 12.

The first housing element 13 is configured in the form of a relatively flat cover. The first housing element 13 which is configured as a cover serves to receive the two circuit boards 15, 17 and the preload device 16 arranged between the two circuit boards 15, 17. The first circuit board 15, the second circuit board 17, the preload device 16, the heat-conducting element 14, and the cooling device 12 are therefore positioned between the two housing elements 13, 18.

As already mentioned, according to the first embodiment of the control apparatus 7, the upper housing element 18 may be omitted.

For the installation or for the assembly of the control apparatus 7 according to the first embodiment, the cooling device 12 is screwed to the lower housing element 18, which is configured as a cover, and therefore an intermediate space is produced between the cooling device 12 and the housing element 13. The heat-conducting element 14, the circuit board 15, and the preload device 16 are positioned in the intermediate space, cf. FIGS. 1 and 4.

In contrast thereto, for the installation or for the assembly of the control apparatus 7 according to the second embodiment, the cooling device 12 is screwed to the first housing element 18, which is configured as a cup. The first (upper) housing element 13 is in turn screwed by means of screws 24 to the second (lower) housing element 18, which is configured as a cover. Again, an intermediate space is produced between the first (upper) housing element 13 and the second (lower) housing element 18, in which intermediate space the heat-conducting element 14, the first circuit board 15, the preload device 16, and the second circuit board 17 are positioned, cf. FIG. 2.

LIST OF REFERENCE SIGNS

1 Power tool
2 Housing
2*a* Front end of the housing
2*b* Rear end of the housing
2*c* An upper end of the housing
2*d* The lower end of the housing
3 Drive
4 Impact mechanism
5 Tool fitting
6 Power supply
7 Control apparatus
8 Transmission
9 Tool
10 Handle
11 Interface
12 Cooling device
12*a* Baseplate
12*b* Cooling element
13 First housing element
14 Heat-conducting element
15 First circuit board
16 Preload device
17 Second circuit board
18 Second housing element
19 Ventilation openings
20 Cutout
21 Carrier plate
21*a* First side of the carrier plate
21*b* Second side of the carrier plate
22 Component
23 Spring element
23*a* Small triangular elevation
23*b* Large cylindrical elevation
23*c* Pad
23*d* Web
24 Screw

The invention claimed is:

1. A control apparatus for a power tool, the control apparatus comprising:

at least one circuit board;

a heat-conductor;

a cooler for cooling the at least one circuit board;

at least one housing element, wherein, in a mounted state of the control apparatus, the circuit board and the heat-conductor are arranged between the cooler and the housing element, and the heat-conductor is positioned between the circuit board and the cooler; and a preloader between the housing element and the at least one circuit board to press the circuit board against the heat-conductor in a predefined direction;

the preloader including a first spring and a second spring;

the first spring having a first extent in a direction and the second spring having a second different extent in the direction, wherein the first spring has a greater size than the second spring.

2. The control apparatus as recited in claim 1 wherein the preloader is configured at least partially from a resilient material.

3. The control apparatus as recited in claim 1 wherein the preloader is configured at least partially from silicone.

4. The control apparatus as recited in claim 1 wherein the preloader includes a plurality of triangular springs, the first spring being one of the plurality of triangular springs.

5. The control apparatus as recited in claim 4 wherein the preloader further includes a plurality of cylindrical springs, the plurality of cylindrical springs each being larger than each of the plurality of triangular springs, the second spring being one of the plurality of the cylindrical springs.

6. The control apparatus as recited in claim 5 wherein the preloader further includes webs, the webs being present between each of the plurality of triangular springs and each of the plurality of cylindrical springs.

7. The control apparatus as recited in claim 1 wherein the at least one circuit board includes a carrier plate and a plurality of electronic components, the carrier plate having a first side and a second side, the electronic components being fastened to the first side.

8. The control apparatus as recited in claim 7 wherein the first extent is a function of the size of at least one electronic component of the plurality of electronic components.

9. The control apparatus as recited in claim 8 wherein the second extent is a function of the size of at least one further electronic component of the plurality of electronic components.

10. The control apparatus as recited in claim 1 wherein the first spring is a triangular spring.

11. The control apparatus as recited in claim 10 wherein the second spring is a cylindrical spring.

12. The control apparatus as recited in claim 1 wherein the preloader includes a plurality of springs in addition to the first and second springs.

13. The control apparatus as recited in claim 1 wherein the heat-conductor is a flat pad, the flat pad being made of copper.

14. The control apparatus as recited in claim 1 wherein the at least one housing element includes a first housing and a second housing, the first housing being below the second housing.

15. The control apparatus as recited in claim 14 wherein the second housing has a cutout, the cooler being fastened to the cutout.

16. The control apparatus as recited in claim 1 wherein the cooler includes a baseplate and a plurality of cooling ribs.

17. A power tool comprising the control apparatus as recited in claim 1, the power tool further comprising a tool housing, the tool housing comprising a plurality of ventilation openings.

18. The power tool as recited in claim 17 wherein the cooler is arranged next to the ventilation openings.

19. A control apparatus for a power tool, the control apparatus comprising:

at least one circuit board;

a heat-conductor;

a cooler for cooling the at least one circuit board;

at least one housing element, wherein, in a mounted state of the control apparatus, the circuit board and the heat-conductor are arranged between the cooler and the housing element, and the heat-conductor is positioned between the circuit board and the cooler; and a preloader between the housing element and the at least one circuit board to press the circuit board against the heat-conductor in a predefined direction;

the preloader including a first spring and a second spring;

the first spring having a first extent in a direction and the second spring having a second different extent in the direction, wherein the preloader includes a plurality of springs in addition to the first and second springs.

* * * * *